(12) United States Patent
Arita

(10) Patent No.: US 7,060,531 B2
(45) Date of Patent: Jun. 13, 2006

(54) METHOD OF CUTTING SEMICONDUCTOR WAFER AND PROTECTIVE SHEET USED IN THE CUTTING METHOD

(75) Inventor: Kiyoshi Arita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 145 days.

(21) Appl. No.: 10/732,677

(22) Filed: Dec. 10, 2003

(65) Prior Publication Data

US 2004/0121611 A1    Jun. 24, 2004

(30) Foreign Application Priority Data

Dec. 11, 2002  (JP) ................. P. 2002-359051

(51) Int. Cl.
*H01L 21/50*  (2006.01)
(52) U.S. Cl. .................. 438/114; 438/464; 438/465
(58) Field of Classification Search ............... 438/113, 438/114, 458, 462, 464, 465
See application file for complete search history.

(56) References Cited

U.S. PATENT DOCUMENTS

| | | |
|---|---|---|
| 5,268,065 A | 12/1993 | Grupen-Shemansky |
| 5,275,958 A | 1/1994 | Ishikawa |
| 5,972,781 A | 10/1999 | Wegleiter et al. |
| 6,020,217 A * | 2/2000 | Kuisl et al. .......... 438/106 |
| 6,221,751 B1 * | 4/2001 | Chen et al. .......... 438/612 |

FOREIGN PATENT DOCUMENTS

| | | |
|---|---|---|
| EP | 0 807 963 A2 | 11/1997 |
| JP | 2002-93752 | 3/2002 |

OTHER PUBLICATIONS

Patent Abstracts of Japan, Yoshi Yasuhiro, "Copper Foil Laminate with Adhesive and Its Manufacturing Method", Publication No.: 2002-273824, Publication Date: Sep. 25, 2002, 1 page.

* cited by examiner

*Primary Examiner*—Mary Wilczewski
*Assistant Examiner*—Toniae M. Thomas
(74) *Attorney, Agent, or Firm*—Pearne & Gordon LLP

(57) ABSTRACT

In a method of cutting a semiconductor wafer in which the semiconductor wafer 6 is cut by plasma etching, a protective sheet 30 on which a metallic layer 30*b*, a plasma etching rate of which is low, is formed on one face of an insulating sheet 30*a* is stuck on to a circuit forming face 6*a* by an adhesive layer 30*c*, and plasma is exposed onto an opposite side to the circuit forming face 6*a* from a mask side which is formed by covering regions except for cutting lines 31*b* with a resist film 31*a* so as to conduct plasma etching on portions of the cutting lines. Due to the above structure, it is possible to use the metallic layer as an etching stop layer for suppressing the progress of etching. Therefore, fluctuation of the progress of etching can be avoided and heat damage caused on the protective sheet can be prevented.

4 Claims, 6 Drawing Sheets

METHOD OF CUTTING SEMICONDUCTOR WAFER AND PROTECTIVE SHEET USED IN THE CUTTING METHOD

BACKGROUND OF THE INVENTION

The present invention relates to a method of cutting a semiconductor wafer by means of plasma etching. The present invention also relates to a protective sheet used in the method of cutting the semiconductor wafer.

A semiconductor device mounted on a board of electronic equipment is conventionally manufactured in such a manner that pins of a lead frame and metallic bumps are connected to semiconductor elements, on which a circuit pattern is formed in the state of a wafer, and the semiconductor elements are subjected to a packaging process so that they can be sealed with resin. Since the size of electronic equipment has been recently reduced, the size of the semiconductor device has been also decreased. Especially, investigations are actively made into the reduction of the thickness of a semiconductor element.

The mechanical strength of the semiconductor element, the thickness of which is reduced, is so low that the semiconductor element is liable to break in the process of cutting conducted in the dicing step in which the semiconductor element in the state of a wafer is cut into individual pieces, and the yield of machining is inevitably lowered. Concerning the method of cutting the semiconductor element, the thickness of which is reduced, instead of the mechanical cutting method, a plasma dicing method is proposed in which the semiconductor wafer is cut when cutting grooves are formed by the etching action of plasma. Concerning this method, for example, refer to Japanese Publication JP-A-2002-93752.

However, in the process of plasma dicing of the prior art described above, due to the want of uniformity of etching action conducted by plasma, the following problems are caused and have not been solved yet. In the process of plasma etching, masking is conducted on a semiconductor wafer in which regions except for the cutting lines are covered with a resist layer. After the completion of masking, the semiconductor wafer is accommodated in a processing chamber in a plasma processing device, and only regions of the cutting lines are exposed to plasma in the processing chamber so as to remove these portions by means of etching.

In this connection, an etching rate showing the degree of etching conducted by plasma is not necessarily uniform. Therefore, the etching rate distribution fluctuates in the processing chamber. Accordingly, in the process of plasma dicing conducted in the processing chamber, silicon in the portions of the cutting lines, which are located in a range of a high etching rate, is more quickly removed than silicon in the other portions. Therefore, cutting is more quickly completed in these portions.

The cutting lines in these portions of the high etching rate, are successively exposed to plasma until silicon in the portions of the cutting lines located in regions of the low etching rate is removed. Accordingly, when silicon is completely removed from the regions of the high etching rate, the protective sheet on the lower face side of the semiconductor wafer is directly exposed to plasma.

When the plasma processing continues in the above state, heat generated by plasma directly acts on the protective sheet. As a result, there is a possibility that the protective sheet is superheated, burned and deformed. According to the conventional plasma dicing method, it is impossible to effectively prevent the protective sheet from being damaged by heat caused by the want of uniformity of the etching action of plasma.

SUMMARY OF THE INVENTION

Therefore, it is an object of the present invention to provide a method of cutting a semiconductor wafer capable of preventing a protective sheet from being damaged by heat when the semiconductor wafer is cut by plasma etching. It is also an object of the present invention to provide the protective sheet used in the method of cutting the semiconductor wafer.

According to the present invention, a method of cutting a semiconductor wafer in which the semiconductor wafer, on the first face of which semiconductor elements are formed, is cut by plasma etching from the second face opposite to the first face, comprises: a sheet attaching step of attaching a protective sheet onto the first face; a mask formation step of forming a mask to determine cutting lines on the second face for cutting the semiconductor wafer; and a plasma etching step of conducting plasma-etching on portions of the cutting lines by exposing the semiconductor wafer to the plasma from the mask side, wherein the protective sheet is composed of an insulating sheet, which becomes the base material, and a metallic layer, a plasma etching rate of which is lower than that of the semiconductor wafer, provided on one face of the insulating sheet, and the metallic layer side is attached onto the first face via an adhesive layer in the sheet attaching step.

Preferably, plasma generating gas used in the plasma dicing step may contain at least gas of fluorine, and the metallic layer may contain either aluminum or copper.

According to another aspect of the present invention, it is provided a protective sheet used in a method of cutting a semiconductor wafer, the protective sheet being attached onto a first face of the semiconductor wafer when the semiconductor wafer, on the first face of which semiconductor elements are formed, is cut by plasma etching from the second face opposite to the first face, the protective sheet comprising: an insulating sheet that becomes the base material; and a metallic layer provided on one face of the insulating sheet and made of metal, a plasma etching rate of which is lower than that of the semiconductor wafer.

Preferably, plasma generating gas used in the plasma etching may contain at least gas of fluorine, and the metallic layer may contain either aluminum or copper.

Further, an adhesive layer may be provided on a face of the metallic layer.

According to the present invention, in a method of cutting a semiconductor wafer by plasma etching, a protective sheet is used, on which a metallic layer, a plasma etching rate of which is lower than that the semiconductor wafer, is formed on one face of an insulating sheet which is the base material, and this metallic layer is utilized as an etching stop layer for suppressing the progress of plasma etching. Due to the foregoing, it is possible to realize operation of effective plasma etching in which fluctuation of the progress of plasma etching is avoided, so that the occurrence of heat damage given to a protective sheet in the process of cutting can be prevented.

DETAILED DESCRIPTION OF THE PREFERRED EMBODIMENTS

Figure 1:
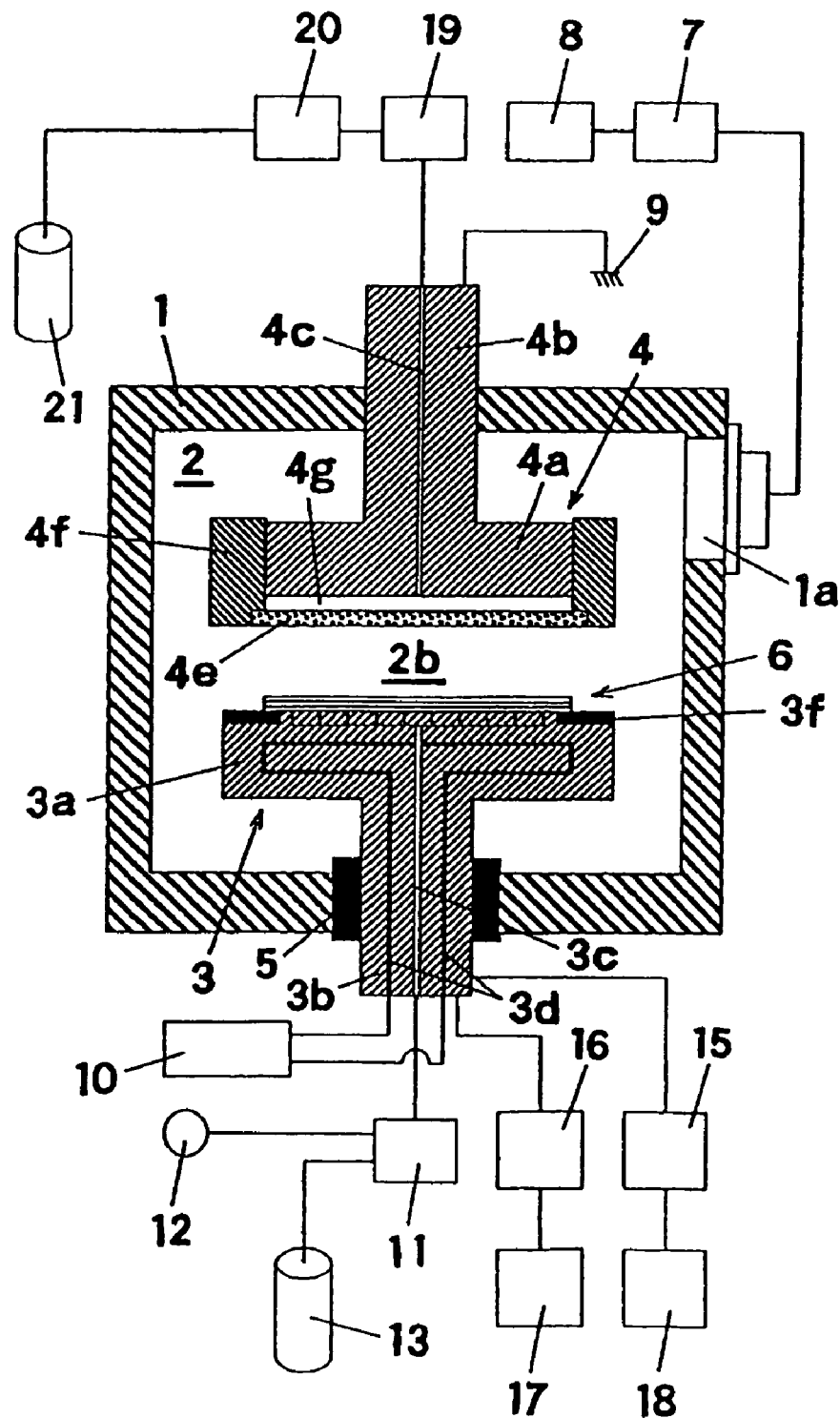
FIG. 1 is a cross sectional side view of a plasma processing device of an embodiment of the present invention.

Next, referring to the drawings, an embodiment of the present invention will be explained below.

First, referring to FIGS. 1 to 3(b), the plasma processing device will be explained below. This plasma processing device is used in the manufacturing process of a semiconductor device obtained in such a manner that a semiconductor wafer, on the circuit forming face (the first face) of which a plurality of semiconductor elements are formed, is divided into individual piece of the semiconductor elements so as to obtain a semiconductor device, the thickness of which is not more than 100 μm.

In the manufacturing process of this semiconductor device, first of all, a protective sheet made of material, a plasma etching rate of which is lower compared with silicon that is a primary material of the semiconductor, is attached to the circuit forming face of the semiconductor wafer. On the reverse face opposite to the circuit forming face of the semiconductor wafer, a mask to determine cutting lines used for dividing the semiconductor wafer into individual pieces of the semiconductor elements is formed. The step of plasma dicing is conducted on the above semiconductor wafer by the present plasma processing device.

In FIG. 1, the processing chamber 2 for conducting plasma processing on the semiconductor wafer is provided inside the vacuum chamber 1. This processing chamber 2 forms a tightly sealed space for generating plasma in the state of reduced pressure. In a lower portion inside the processing chamber 2, the lower electrode 3 is arranged. In an upper portion of the lower electrode 3, the upper electrode 4 is arranged being opposed to the lower electrode 3. The lower electrode 3 and the upper electrode 4 are respectively formed into a cylindrical shape and arranged in the processing chamber 2 concentrically with each other.

The lower electrode 3 is made of conductive material such as aluminum. The profile of the lower electrode 3 is formed in such a manner that the supporting portion 3b is extended downward from the disk-shaped electrode portion 3a. When the supporting portion 3b is held by the vacuum chamber 1 via the insulating material 5C, the lower electrode 3 is attached being electrically insulated. The upper electrode 4 is made of conductive material such as aluminum in the same manner as that of the lower electrode 3. The support portion 4b is extended upward from the disk-shaped electrode portion 4a.

The support portion 4b is electrically continued to the vacuum chamber 1 and can be elevated by the electrode elevating mechanism 24 not shown in the drawing. Under the condition that the upper electrode 4 is lowered, an electric discharge space for generating a plasma electric discharge used for plasma processing is formed between the upper electrode 4 and the lower electrode 3. The electrode elevating mechanism 24 functions as an electrode distance changing means. When the upper electrode 4 is elevated by the electrode elevating mechanism 24, the electrode distance between the lower electrode 3 and the upper electrode 4 can be changed.

Next, explanations will be made into the structure of the lower electrode 3 and the semiconductor wafer to be processed. An upper face of the electrode portion 3a of the lower electrode 3 is a plane-shaped holding face on which the semiconductor wafer is put. The insulating coating layer 3f is provided in an outer peripheral portion of the holding face. The insulating coating layer 3f is made of ceramics such as aluminum. Due to the above structure, the outer peripheral portion of the lower electrode 3 is insulated from plasma generated in the electric discharge space 2b, so that the occurrence of an abnormal electric discharge can be prevented.

Figure 2:
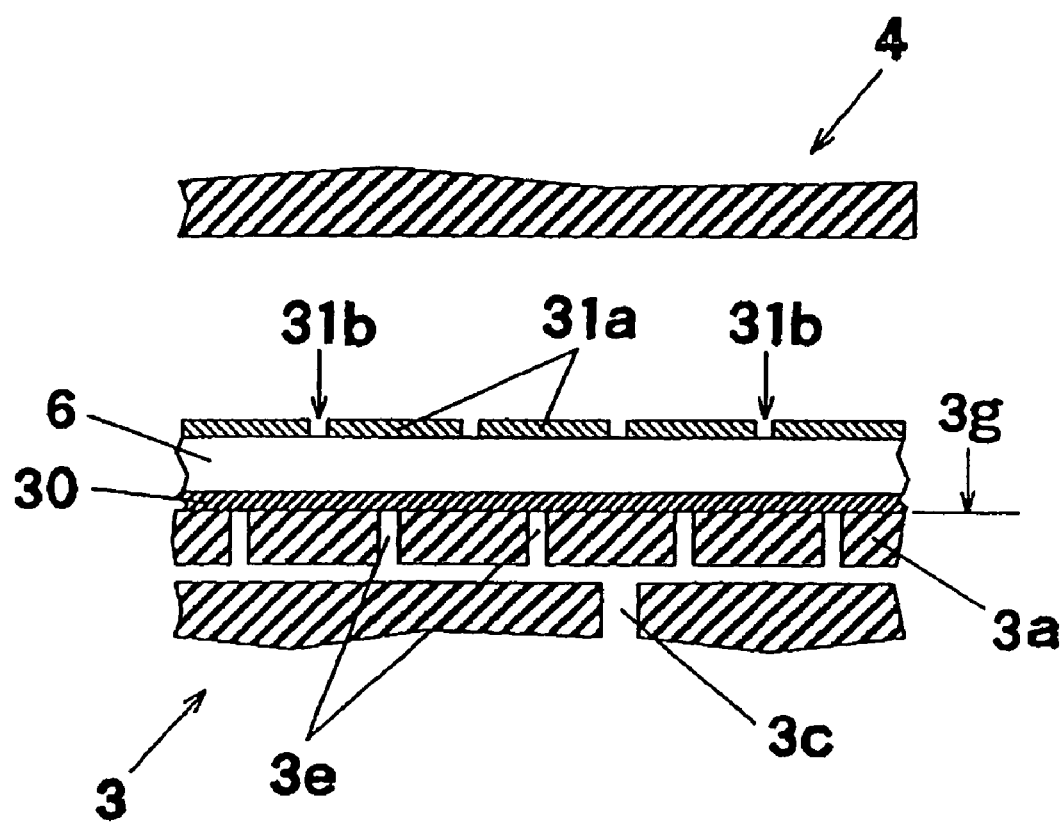
FIG. 2 is a partially cross sectional view of a lower electrode of the plasma processing device of the embodiment of the present invention.

FIG. 2 is a view showing a state in which the semiconductor wafer 6 before the start of plasma dicing is put on the lower electrode 3. The semiconductor wafer 6 is a semiconductor substrate, the primary component of which is silicon. The protective sheet 30 is attached to the circuit forming face (the first face) of the surface (the lower face in FIG. 2) of the semiconductor wafer 6. Under the condition that the semiconductor wafer 6 is put on the lower electrode 3, the protective sheet 30 is tightly contacted with the holding face 3g of the electrode portion 3a.

Figure 6:
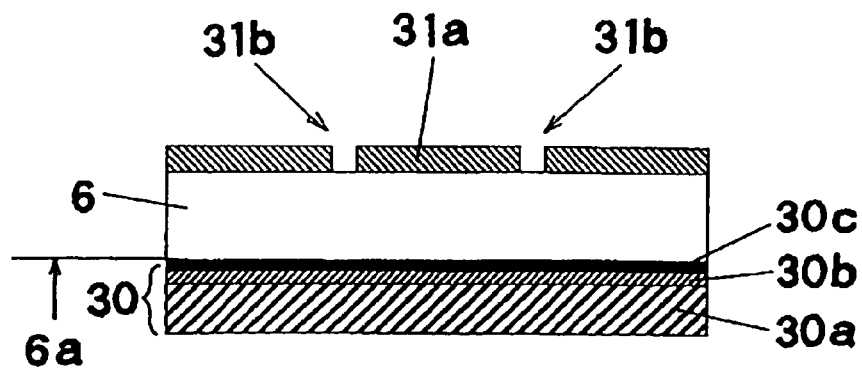
FIGS. 6(a) to 6(c) is a schematic illustration for explaining a process of method of manufacturing the semiconductor device of the embodiment of the present invention.
Figure 6:
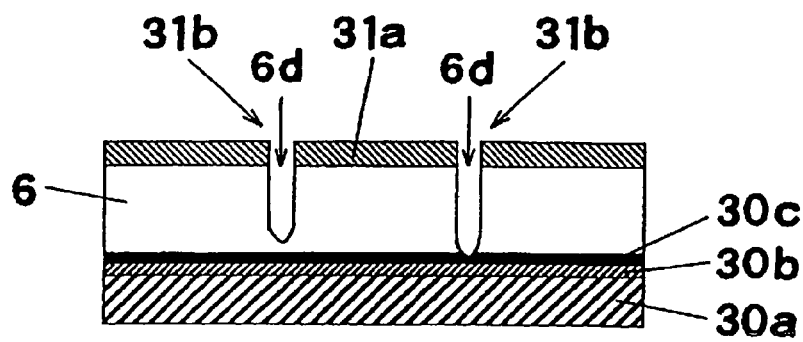
Figure 6:
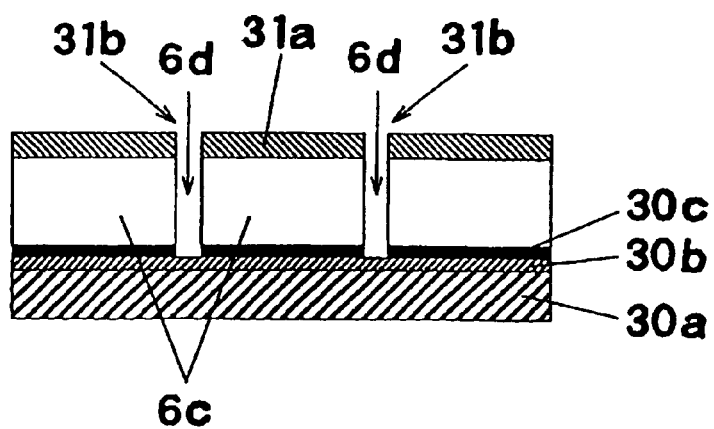

The protective sheet is composed in such a manner that a metallic layer, a plasma etching rate of which is lower than that of the semiconductor wafer 6, for example, the metallic layer 30b containing either aluminum or copper is formed on one face of the insulating sheet 30a of the base material and the adhesive layer 30c is provided on a surface of the metallic layer 30b as shown in FIG. 6. In the case of attaching the protective sheet 30 onto the semiconductor wafer 6, the metallic layer 30b side is attached onto the circuit formation face via the adhesive layer 30c.

Due to the foregoing, even if the etching rate of the semiconductor wafer partially fluctuates since the etching rate distribution by plasma is not uniform in the process of plasma dicing, the metallic layer 30b functions as an etching stop layer.

The insulating sheet 30a is a resin sheet made of insulating resin such as polyolefine, polyimide or polyethylene terephthalate and formed into a film of 100 μm thickness. Under the condition that the protective sheet 30 is attached to the semiconductor wafer 6, the insulating sheet 30a functions as a dielectric body when the semiconductor wafer 6 is electrostatically attracted to the holding face 3g of the electrode portion 3a.

On the reverse face (the second face) on the opposite side (the upper side in FIG. 2) to the circuit forming face, a mask for determining the cutting lines in the process of plasma dicing described later is formed. This mask is formed when patterning is conducted with a resist film after the reverse face is machined as described later. Due to the foregoing, a region except for the portion of the cutting line 31b, which is an object of plasma etching, is covered with the resin film 31a.

As shown in FIG. 2, a plurality of attracting holes 3e, which are open to the holding face 3g, are provided in the lower electrode 3. These attracting holes 3e are communicated with the suction holes 3c provided in the lower electrode 3. As shown in FIG. 1, the suction holes 3c are connected to the vacuum suction pump 12 via the gas line changeover valve 11. The gas line changeover valve 11 is connected to the $N_2$ gas supply section 13 for supplying nitrogen gas. When gas line changeover valve 11 is changed over, the suction holes 3c can be connected being selectively changed over between the vacuum suction pump 12 and the $N_2$ gas supply section 13.

When the vacuum pump 12 is driven under the condition that the suction holes 3c are communicated with the vacuum suction pump 12, vacuum suction is conducted from the attracting holes 3e and the semiconductor wafer 6, which is put on the lower electrode 3, is attracted by vacuum and held. Accordingly, the attracting holes 3e, the suction holes 3c and the vacuum suction pump 12 compose the attracting and holding means for holding the semiconductor wafer 6 under the condition that the protective sheet 30 is tightly contacted with the holding face 3g of the electrode portion 3a when vacuum suction is conducted from the attracting holes 3e which are open to the holding face 3g of the lower electrode 3.

When the suction holes 3c are connected to the $N_2$ gas supply section 13, $N_2$ gas can be blown out from the attracting holes 3e to the lower face of the protective sheet 30. As described later, this $N_2$ gas, which is blown out from the attracting holes 3e to the lower face of the protective sheet 30, is blown out for the object of forcibly detaching the protective sheet 30 from the holding face 3g.

A coolant flow passage 3d in which coolant used for cooling flows is provided in the lower electrode 3. The coolant flow passage 3d is connected to the cooling mechanism 10. When the cooling mechanism 10 is driven, coolant such as cooling water circulates in the coolant flow passage 3d. Therefore, the lower electrode 3 and the protective sheet 30 on the lower electrode 3, the temperatures of which are raised by heat generated in the process of plasma processing, are cooled by the circulating coolant. The coolant flow passage 3d and the cooling mechanism 10 compose the cooling means for cooling the lower electrode 3.

The exhaust port 1a, which is communicated with the processing chamber 2, is connected to the vacuum pump 8 via the exhaust changeover valve 7. When the exhaust changeover valve 7 is changed over and the vacuum pump 8 is driven, the inside of the processing chamber 2 of the vacuum chamber 1 is exhausted by vacuum, so that the pressure in the processing chamber 2 can be reduced. The processing chamber 2 is provided with a pressure sensor 28 which is omitted in the drawing. When the vacuum pump 8 is controlled according to the result of measuring the pressure by this pressure sensor 28, the pressure in the processing chamber 2 can be reduced to a desired value. The vacuum pump 8 composes a pressure reducing means for reducing the pressure in the processing chamber 2 to a desired value. When the exhaust changeover valve 7 is changed over to the atmospheric air side, the atmosphere is introduced into the processing chamber 2, and the pressure in the processing chamber 2 can be returned to the atmospheric pressure.

Next, the upper electrodes 4 will be explained in detail. The upper electrodes 4 includes: a central electrode 4a; and an extending portion 4f made of insulating material which surrounds the electrode portion 4a and extends to the outer circumferential portion of the central electrode 4a. The profile of the extending portion 4f is larger than that of the lower electrode 3 and arranged being extended outside the lower electrode 3. A gas blowing portion 4e is provided at the central portion on the lower face of the upper electrode 4.

The gas blowing portion 4e supplies gas for generating plasma which is used for generating plasma electric discharge in the electric discharge space formed between the upper electrode 4 and the lower electrode 3. The gas blowing portion 4e is a circular plate member made of porous material having a large number of minute holes in it. Gas for generating plasma is uniformly blown out from the gas staying space 4g into the electric discharge space via the minute holes so that gas can be uniformly supplied.

A gas supply hole 4c communicating with the gas staying space 4g is provided in the support portion 4b. The gas supply hole 4c is connected to the first plasma generating gas supply section 21 via the gas flow rate adjusting section 19 and the gas opening and closing valve 20. The plasma generating gas supply section 21 supplies mixed gas containing fluorine gas such as mixed gas in which sulfur hexafluoride ($SF_6$) or carbon tetrafluoride ($CF_4$) is mixed with helium gas.

When the gas opening and closing valve 20 is opened, it is possible to supply the plasma generating gas from the plasma generating gas supply section 21 into the electric discharge space 2b via the gas blowing section 4e.

In the above plasma generating gas supply system, when the gas flow rate adjusting section 19 is controlled according to a command sent from the control section not shown in the drawing, a flow rate of gas supplied into the electric discharge space 2b can be arbitrarily adjusted. Due to the foregoing, pressure in the processing chamber 2, into which plasma generating gas is supplied, is controlled according to the plasma processing condition, which has been previously set, and according to the pressure in the processing chamber 2 detected by the pressure sensor. Accordingly, the gas flow rate adjusting section 19 composes the pressure control means for controlling the pressure in the processing chamber 2.

The lower electrode 3 is electrically connected to the high frequency electric power supply section 17 via the matching circuit 16. When the high frequency electric power supply section 17 is driven, a high frequency voltage is impressed between the upper electrode 4, which is electrically continued to the vacuum chamber 1 grounded to the grounding section 9, and the lower electrode 3. Due to the foregoing, plasma electric discharge is generated in the electric discharge space 2b between the upper electrode 4 and the lower electrode 3. Accordingly, the plasma generating gas supplied to the processing chamber 2 is transferred into a state of plasma. The matching circuit 16 conducts impedance matching between the plasma electric discharge circuit in the processing chamber 2 and the high frequency electric power supply section 17 in the case of generating this plasma.

Figure 3:
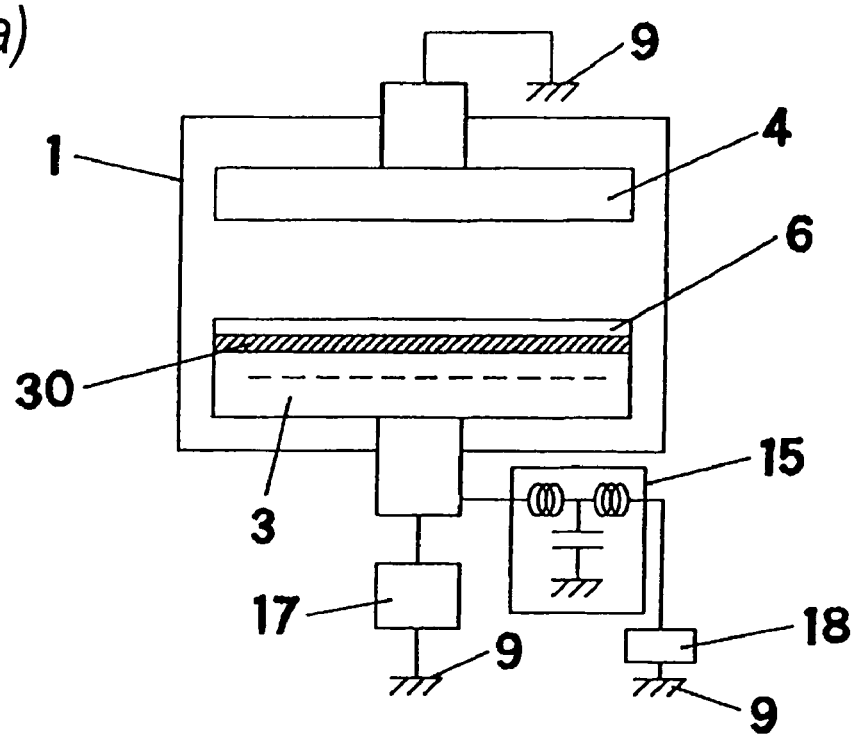
FIGS. 3(a) and 3(b) are cross sectional views of the plasma processing device of the embodiment of the present invention.
Figure 3:
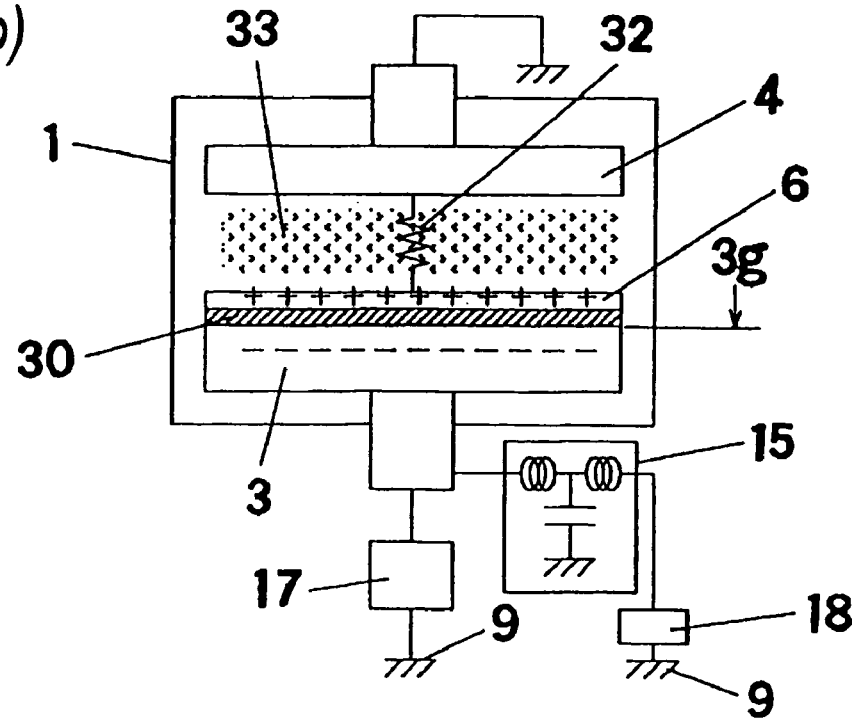

The lower electrode 3 is connected to the electrostatically attracting DC electric power supply section 18 via RF filter 15. When the electrostatically attracting DC electric power supply section 18 is driven, as shown in FIG. 3(*a*), negative electric charges are accumulated on the surface of the lower electrode 3. When plasma is generated in the processing chamber 2 by driving the high frequency electric power supply section 17 as shown by the dotted portion 33 in FIG. 3(*b*), the DC current impressing circuit 32 for connecting the semiconductor wafer 6, which is put on the holding face 3g via the protective sheet 30, to the grounding section 9 is formed in the processing chamber 2 via the plasma. Due to the foregoing, a closed circuit is formed in which the lower electrode 3, RF filter 15, the electrostatically attracting DC electric power supply section 18, the grounding section 9, the plasma and the semiconductor wafer 6 are successively connected in this order, and positive electric charges are accumulated on the semiconductor wafer 6.

Coulomb's force acts between the negative electric charges, which are accumulated on the holding face 3g of the lower electrode 3 made of conductive material, and the positive electric charges which are accumulated on the semiconductor wafer 6 via the protective sheet 30 containing the insulating layer which is a dielectric body. By this Coulomb's force, the semiconductor wafer 6 is held by the lower electrode 3. At this time, RF filter 15 prevents the high frequency voltage of the high frequency electric power supply section 17 from being directly given to the electrostatically attracting DC electric power supply section 18. In this connection, the polarity of the electrostatically attracting DC electric power supply section 18 may be reversed.

In the above constitution, the electrostatically attracting DC electric power supply section 18 composes the DC voltage impressing means for electrostatically attracting the semiconductor wafer 6 by utilizing Coulomb's force acting between the semiconductor wafer 6 and the holding face 3g of the lower electrode 3, which are separate from each other by the protective sheet 30, when DC voltage is impressed upon the lower electrode 3. That is, concerning the holding means for holding the semiconductor wafer 6 on the lower electrode 3, the vacuum attracting means for attracting the protective sheet 30 via the plurality of attracting holes 3e, which are open to the holding face 3g, by vacuum and the DC voltage impressing means described above are provided, and these two types of means are properly used.

On the side of the processing chamber 2, there is provided an opening portion (not shown in the drawing), which can be freely opened and closed, for carrying in and out an object to be processed.

In the case of carrying in and out the semiconductor wafer 6, the upper electrode 4 is raised by the electrode elevating mechanism, and a conveyance space is ensured on the lower electrode 3. Under this condition, the semiconductor wafer 6 is carried in and out by the wafer conveyance mechanism via the opening section.

Figure 4:
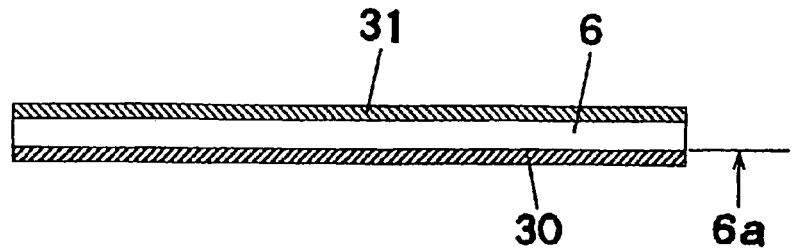
FIGS. 4(a) to 4(e) are schematic illustration for explaining a process of method of manufacturing the semiconductor device of the embodiment of the present invention.
Figure 4:
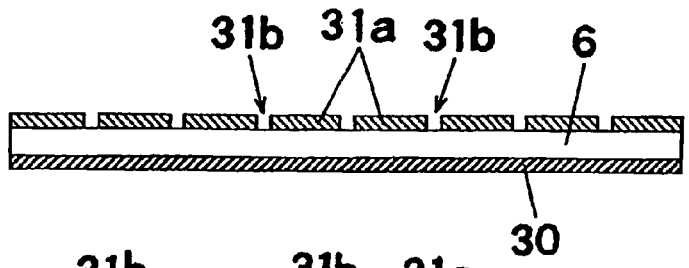
Figure 4:
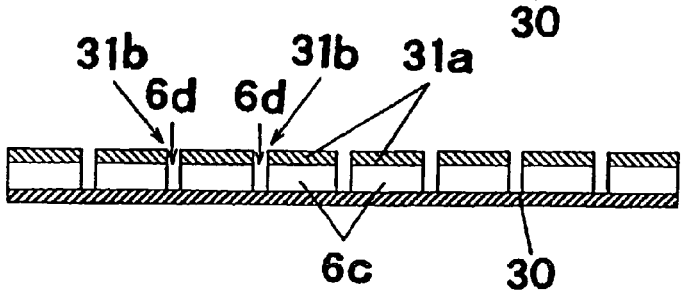
Figure 4:
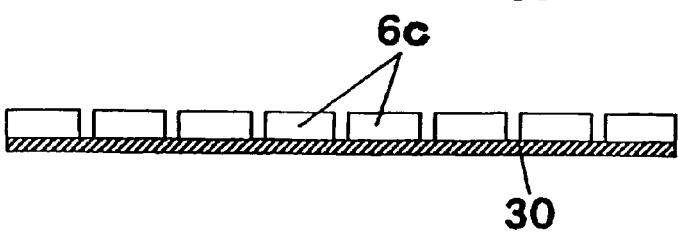
Figure 4:
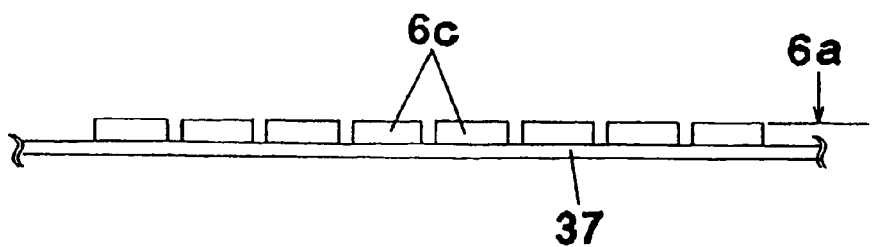

The plasma processing device is composed as described above. Referring to FIG. 4 and the other drawings, explanations will be made into the method of manufacturing the semiconductor device, in which the above plasma processing device is used, and the plasma processing method carried out in the process of the method of manufacturing this semiconductor device.

First, in FIG. 4(a), reference numeral 6 is a semiconductor wafer, on which a plurality of semiconductor elements are formed, the thickness of which is reduced by machining. In the thickness reducing step conducted before, the thickness is reduced to a value not more than 100 µm. Before the thickness reducing step, the protective sheet 30 is attached onto the circuit forming face (the first face) of semiconductor wafer 6 (the sheet attaching step).

In this case, the profile of the protective sheet 30 is the same as that of the semiconductor wafer 6 so that the protective sheet 30 can cover the overall circuit forming face 6a and can not protrude outside the semiconductor wafer 6. Due to the foregoing, the protective sheet 30 is not exposed to plasma in the plasma processing conducted later. Therefore, it is possible to prevent the protective sheet 30 from being damaged by plasma.

On the reverse face (the second face) of the circuit forming face 6a of the semiconductor wafer 6 after the thickness reducing step, the resist film 31 is formed covering the overall face of the semiconductor wafer 6. This resist film 31 is used for forming a mask to determine the cutting lines for dividing the semiconductor wafer 6 into individual pieces of the semiconductor elements. Patterning is conducted on the resist film 31 by means of photolithography so as to remove portions of the resist film 31 corresponding to the cutting lines 31b. Due to the foregoing, on the reverse face of the semiconductor wafer 6, the mask is formed, the region except for the portions of the cutting lines 31b of which is covered with the resist film 31a. The semiconductor wafer 6 having the mask in this state becomes an object to be processed by means of plasma processing (the mask formation step).

Figure 5:
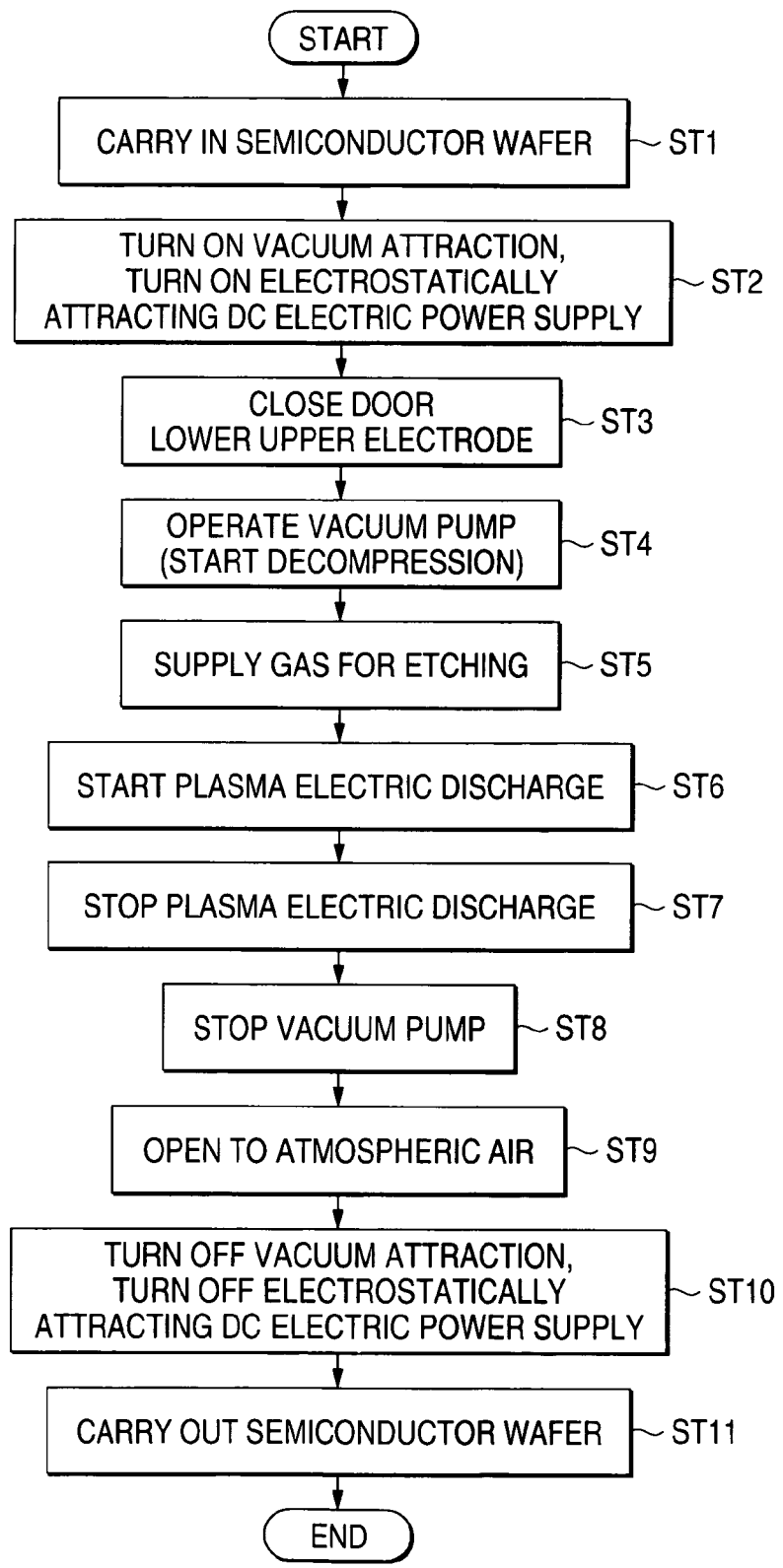
FIG. 5 is a flow chart of the plasma processing method of the embodiment of the present invention.

Referring to the flow chart shown in FIG. 5 and also referring to each drawing, the plasma processing method, the object to be processed of which is this semiconductor wafer 6 having the mask, will be explained below. First, the semiconductor wafer 6 having the mask is conveyed into the processing chamber 2 (ST1). Next, the vacuum attracting pump 12 is driven so as to attract from the attracting holes 3e by vacuum, and the vacuum attraction of the semiconductor wafer 6 is turned on and the electrostatically attracting DC electric power supply section 18 is turned on (ST2). By this vacuum attraction, the semiconductor wafer 6 is held by the lower electrode 3 while the protective sheet 30 is being tightly contacted with the holding face 3g of the lower electrode 3.

After that, the door of the processing chamber 2 is closed and the upper electrode 4 is lowered (ST3). Due to the foregoing, the electrode distance between the upper electrode 4 and the lower electrode 3 is set at the electrode distance shown by the plasma processing condition. Next, the vacuum pump 8 is set in motion so as to start decompressing the processing chamber 2 (ST4). When the degree of vacuum in the processing chamber 2 has reached a predetermined value, the etching gas (the plasma dicing gas) composed of mixed gas containing sulfur hexafluoride and helium is supplied from the plasma generating gas supply section 21 (ST5).

When the pressure in the processing chamber 2 has reached a value shown in the plasma processing condition, the high frequency electric power supply 18 is driven, and a high frequency voltage is impressed between the upper electrode 4 and the lower electrode 3, so that an electric discharge of plasma is started (ST6). Due to the foregoing, the plasma dicing gas containing fluorine gas is transferred into a plasma state in the electric discharge space between the upper electrode 4 and the lower electrode 3. By the generation of plasma, fluorine gas such as sulfur hexafluoride is irradiated from the mask side (the resist film 31a side) to the semiconductor wafer 6. By this irradiation of plasma, only portions of silicon of primary material of the semiconductor wafer 6, which are portions of the cutting lines 31b not covered with the resist film 31a, are plasma-etched by plasma of fluorine gas.

At the same time, a DC electric current impression circuit is formed in the electric discharge space between the upper electrode 4 and the lower electrode 3 as shown in FIG. 3. Due to the foregoing, an electrostatically attracting force is generated between the lower electrode 3 and the semiconductor wafer 6, so that the semiconductor wafer 6 is held on the lower electrode 3 by the electrostatically attracting force. Therefore, the protective sheet 30 is tightly contacted with the holding face 3g of the lower electrode 3. Accordingly, the semiconductor wafer 6 can be stably held in the process of plasma processing. At the same time, the protective sheet 30 can be effectively cooled by the cooling function provided by the lower electrode 3, so that the occurrence of heat damage generated by plasma electric discharge can be prevented.

When this plasma etching proceeds, as shown in FIG. 4(e), the cutting groove 6d is formed only in a portion of the cutting line 31b on the semiconductor wafer 6. When the depth of this cutting groove 6d reaches the overall thickness of the semiconductor wafer 6, the semiconductor wafer 6 is divided into individual pieces of the semiconductor elements 6c (the plasma dicing step).

Referring to FIG. 6, the progress of this plasma dicing will be explained below. FIG. 6(a) is a view showing a state before the plasma dicing is started. The protective sheet 30 is attached onto the circuit forming face 6a of the semiconductor wafer 6 via the adhesive layer 30c. When the plasma dicing is started and the plasma of fluorine gas is exposed from the mask side, portions of the cutting lines 31b, which are exposed to the plasma, are plasma-etched, and the cutting grooves 6d are formed inward the semiconductor wafer 6.

FIG. 6(b) is a view showing a state in which the plasma processing time has passed after the plasma etching was started and the formation of the cutting grooves 6d has proceeded. At this time, due to the want of uniformity of the etching rate distribution in the processing chamber 2, the progress of plasma etching fluctuates between the cutting grooves 31b.

For example, in FIG. 6(b), the cutting groove 6d has already penetrated the entire thickness of the semiconductor wafer 6 at the position of the cutting line 31b located on the right in FIG. 6(b), because the etching rate in this region is high. Therefore, plasma etching proceeds to the adhesive layer 30c exposed to the plasma. On the other hand, at the position of the cutting line 31b located on the left in the drawing, the cutting groove 6d has not reached the lower face of the semiconductor wafer 6 yet, because the etching rate in this region is low, that is, the cutting has not been completed in this region.

Concerning the formation of the cutting groove by plasma etching, the degree of progress of etching is not constant in the groove width direction. Therefore, a profile of the cross section of the lower end portion of the groove is formed into a V-shape in which the groove center protrudes downward. Therefore, as shown by the cutting groove 6d on the right in the drawing, even in the state in which the entire thickness of the semiconductor wafer 6 has been cut, the groove width of the cutting groove 6d at the bottom portion is smaller than the width of the cutting line 31b. In the dicing of the semiconductor wafer 6, it is preferable that the semiconductor wafer 6 is cut so that the cutting groove of the uniform groove width can be formed with respect to the entire thickness of the semiconductor wafer 6. In order to form the cutting groove of the uniform groove width, according to the conventional method, it is necessary to make the cutting groove excessively proceed downward in the thickness direction. As a result, the protective sheet 30 is damaged by the heat generated in the process of plasma etching.

FIG. 6(c) is a view showing a state in which a longer plasma processing time has passed. When plasma etching is conducted on the two cutting lines 31b in the state shown in FIG. 6(b), first, on the cutting line 31b located on the right in the drawing, the cutting groove 6d proceeds to the entire thickness of the adhesive layer 30c and reaches the metallic layer 30b. Since the etching rate is very low in the case where plasma of fluorine gas acts on the metallic layer 30c, the progress of the cutting groove 6d in the thickness direction substantially stops on the surface of the metallic layer 30b. On the other hand, plasma etching successively acts on the semiconductor wafer 6 and the adhesive layer 30c. Therefore, when plasma etching is successively conducted for a predetermined period of time, the groove width of the cutting groove at the bottom portion becomes the same as the groove width of the cutting groove at the upper portion. Accordingly, the cutting groove 6d of the uniform groove width can be formed.

In the process of successively conducting plasma etching as described above, on the cutting line 31b located on the left, which is in a region of a low etching rate, the cutting groove 6d is formed with respect to the entire thickness of the adhesive layer 30c as the time passes. In the same manner as described above, the progress of etching in the thickness direction is stopped on the surface of the metallic layer 30b. When plasma etching is successively conducted after that, in the same manner as described above, the groove width at the bottom portion of the cutting groove 6d becomes the same as the groove width at the upper portion. In this way, the cutting groove 6d of the uniform groove width can be formed.

As described above, the metallic layer 30b provided on the protective sheet 30 functions as an etching stop layer for stopping the progress of groove formation in the thickness direction by plasma etching. When this etching stop layer is provided, the occurrence of heat damage caused on the protective sheet 30 by plasma can be prevented and the following effects can be provided.

Until plasma etching proceeds to a state shown in FIG. 6(c), the semiconductor wafer 6 having the mask is successively exposed with plasma, and heat generated by the plasma concentrates on the bottom portion of the cutting groove 6d at the position of the cutting line 31b. Therefore, in the state shown in FIG. 6(b), the protective sheet 30 in the periphery of the bottom portion of the cutting groove 6d is intensively heated. Even in the above state, since the metallic layer 30b, which functions as an etching stop layer, is provided on the protective sheet 30 between the insulating layer 30a and the semiconductor wafer 6, plasma etching does not proceed downward to the insulating layer 30a.

Since the metallic layer 30b is made of material of a high heat conductivity such as aluminum or copper, even if the periphery of the cutting groove 6d is intensively heated, the heat diffuses to the entire face of the protective sheet. The thus diffused heat is transmitted to the holding face 3g of the lower electrode 3 cooled by a cooling means. Accordingly, the protective sheet is not superheated in the process of plasma etching, that is, no problems are caused, and plasma dicing can be executed in a good condition.

When plasma processing is successively conducted for a predetermined period of time, plasma dicing is completed. Then, the electric discharge of plasma is stopped (ST7). After that, the vacuum pump 8 is stopped (ST8), and the exhaust changeover valve 7 is changed over so that it can be opened to the atmospheric air (ST9). Due to the foregoing, pressure in the processing chamber returns to the atmospheric pressure. Then, the vacuum attraction is turned off and the electrostatically attracting DC electric power supply is turned off (ST10). Due to the foregoing, the semiconductor wafer 6, which has been divided into individual pieces of the semiconductor elements 6c and held on the protective tape 30, is released from the attraction.

After that, the semiconductor wafer 6, which has been subjected to plasma processing, is carried out (ST11). While nitrogen gas is being blown out from the attracting holes 3e, the semiconductor wafer 6 is attracted and held by a handling mechanism not shown such as an attracting head and carried outside the processing chamber 2. In the process of plasma dicing, the protective sheet 30 is entirely covered with the semiconductor wafer 6 as described above. Therefore, no damage such as a heat deformation, which is caused when the protective sheet is exposed to plasma, is not generated. Accordingly, the protective sheet 30 always comes into close contact with the holding face 3g and the semiconductor wafer 6, and it fulfills its function.

The semiconductor wafer 6 carried out together with the protective sheet 30 is sent to the mask removing step. As shown in FIG. 4(d), the resist film 31a is removed from the individual pieces of the semiconductor elements 6c. Then, the semiconductor wafer 6 is sent to the sheet peeling step, and the protective sheet 30 is peeled off from the circuit forming face of the semiconductor device obtained when the semiconductor wafer 6 is divided onto individual pieces of the semiconductor elements 6c (the sheet peeling step). This sheet peeling step is conducted in such a manner that the adhesive sheet 37 for holding is stuck onto the reverse faces of the semiconductor elements 6c so that each semiconductor element 6c can be held on the adhesive sheet 37 as shown in FIG. 4(e).

As explained above, in the method of cutting a semiconductor wafer of the present embodiment, in the process of plasma dicing of cutting the semiconductor wafer by plasma etching, a protective sheet on which a metallic layer, a plasma etching rate of which is lower than that of the semiconductor wafer, is provided on one face of an insulating sheet which becomes the base material, and this metallic layer is used as an etching stop layer for suppressing the progress of etching.

Due to the foregoing, it is possible to solve the conventional unsolved problem of heat damage which is caused on a protective sheet due to the want of uniformity of the etching rate, that is, it is possible to solve the problem of heat damage which is caused on a protective sheet when the protective sheet on the lower face side of the semiconductor wafer is directly exposed to plasma and silicon of the semiconductor wafer is completely removed in a region of a high etching rate.

This embodiment provides an example in which the plasma dicing step is executed by utilizing one type mixed gas containing fluorine gas. However, the plasma dicing step may be executed while a plurality of types of gasses are being changed over stepwise. For example, the constitution of the plasma generating gas supply means and the process may be changed in such a manner that the layer of $SiO_2$ of the semiconductor wafer is etched by plasma of fluorine gas of hydrogen attaching and that the protective film (the passivation film) is etched by plasma of oxygen gas.

According to the present invention, in a method of cutting a semiconductor wafer by means of plasma etching, a protective sheet on which a metallic layer, a plasma etching rate of which is lower than that of the semiconductor wafer, is formed is provided on one face of an insulating sheet which becomes the base material, and this metallic layer is used as an etching stop layer for suppressing the progress of etching. Therefore, it is possible to realize plasma etching, the efficiency of which is high, the fluctuation of the progress of which is avoided. Further, it is possible to prevent a protective sheet from being damaged by heat generated in the process of cutting.

What is claimed is:

1. A method of manufacturing a semiconductor device comprising the steps of:
    providing a semiconductor wafer having a first face and a second face;
    forming semiconductor elements on the first face;
    attaching a protective sheet onto the first face;
    forming a mask on the second face to determine cutting lines on the second face for cutting the semiconductor wafer; and,
    cutting the semiconductor wafer by plasma-etching the cutting lines from the mask side;
    wherein the protective sheet includes an insulating sheet, which becomes the base material, a metallic layer, which has a plasma etching rate lower than a plasma-etching rate of the semiconductor wafer, and
    an adhesive layer, which attaches the metallic layer onto the first face.

2. The method of claim 1, wherein plasma generating gas used in the plasma cutting step comprises fluorine and the metallic layer comprises either aluminum or copper.

3. The method of claim 1, wherein the metallic layer functions as an etching stop layer.

4. The method of claim 1, wherein plasma-etching is performed only from the mask side.

* * * * *